(12) United States Patent
Inaba et al.

(10) Patent No.: US 7,529,074 B2
(45) Date of Patent: May 5, 2009

(54) CHARGE NEUTRALIZER FOR GLASS SUBSTRATE

(75) Inventors: Hitoshi Inaba, Sagamihara (JP);
Masaharu Fujino, Sendai (JP);
Yasuhiko Fukuchi, Sendai (JP);
Kazuyoshi Nakajima, Nagaokakyo (JP);
Masato Kochi, Ichikawa (JP)

(73) Assignee: Future Vision Inc., Tokyo (JP)

( * ) Notice: Subject to any disclaimer, the term of this patent is extended or adjusted under 35 U.S.C. 154(b) by 345 days.

(21) Appl. No.: 11/443,246

(22) Filed: May 31, 2006

(65) Prior Publication Data
US 2007/0188970 A1    Aug. 16, 2007

(30) Foreign Application Priority Data
Feb. 16, 2006    (JP)    ............................. 2006-039471

(51) Int. Cl.
*H02H 1/00*    (2006.01)
(52) U.S. Cl. .................................................. 361/212
(58) Field of Classification Search .................. 361/212
See application file for complete search history.

(56) References Cited

U.S. PATENT DOCUMENTS 4,961,209 A * 10/1990 Rowlands et al. ............. 378/29
5,196,702 A * 3/1993 Tsuji et al. .................... 250/591
6,326,625 B1 * 12/2001 Zur ......................... 250/370.09

FOREIGN PATENT DOCUMENTS

JP    2004-299814    10/2004
JP    2005-035535    2/2005

OTHER PUBLICATIONS

Translation of JP 2749202.B.

\* cited by examiner

*Primary Examiner*—Stephen W Jackson
(74) *Attorney, Agent, or Firm*—Antonelli, Terry, Stout & Kraus, LLP.

(57) ABSTRACT

The present invention provides a charge neutralizer for accurately irradiating a soft X ray into a narrow gap after a glass substrate is lifted up.

A soft X ray is introduced into a gap "d" from a soft X ray charge neutralizer 14, and the soft X ray is detected by a soft X ray optical axis monitor 16. Mounting position adjusting means 15 is adjusted by a detection output from said soft X ray optical axis monitor, and optical axis alignment is performed. Next, according to information from a database 19, a control unit 17 controls gap adjusting means 13, and charge neutralization is performed. Charge neutralization can also be performed by controlling the gap "d" by the gap adjusting means 13 while judging neutralizing conditions as to whether a charged potential measured by an electrometer 18 is within an allowable value by the control unit 17 or not.

16 Claims, 4 Drawing Sheets

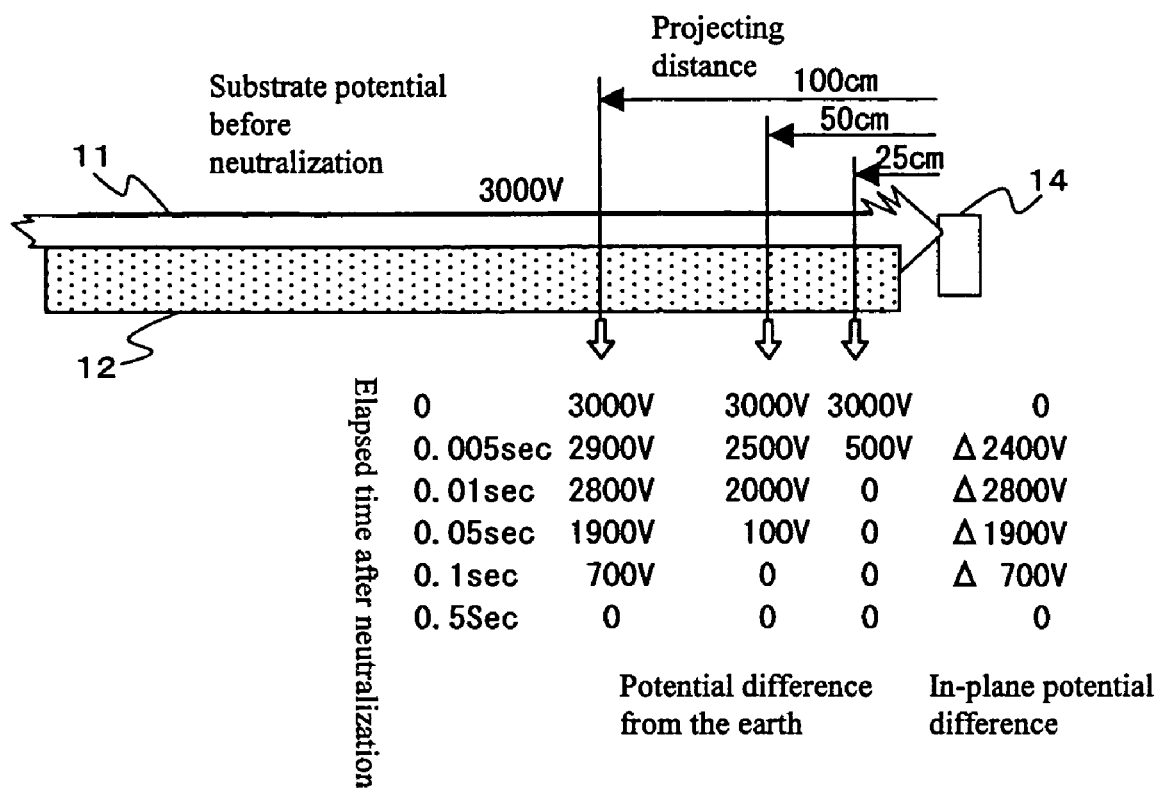

CHARGE NEUTRALIZER FOR GLASS SUBSTRATE

FIELD OF THE INVENTION

1. Technical Field

The present invention relates to a charge neutralizer for a transparent insulating substrate such as a glass substrate. In particular, the invention relate to a charge neutralizer suitable for processes of film deposition or patterning on a glass substrate in the manufacture of a display panel for a liquid crystal display device.

2. Background Art

In the processes of film deposition, patterning process, or transport of a transparent insulating substrate (hereinafter referred as "glass substrate") for a display panel such as a liquid crystal display device, the glass substrate is electrically charged by static electricity. Such electric charge causes troubles on devices, e.g. thin-film transistor, formed on the glass substrate, resulting in the reduction of product reliability or in lower production yield. To eliminate these troubles, charge neutralization is performed on the glass substrate by using a charge neutralizer.

The glass substrate to be used in the liquid crystal display panel is being produced in increasingly larger size. Static electricity is generated when such a large size glass substrate is transported or it is separated or lifted up from a processing table (also called "base" or "stage". Charged electric potential to be generated by the static electricity causes trouble on devices such as thin-film transistor, and charge neutralization must be performed by some means or others. However, a height, to which the glass substrate is lifted up from the table, is determined to suit the convenience in the next process. Also, charge neutralization is performed only at a site where electric charge can be easily neutralized. Current situation is that the charge neutralization is not performed in processes where it must be performed.

As the methods for charge neutralization, soft X ray charge neutralization and ionizer neutralization are known. FIG. 6 represents drawings for comparing performance characteristics between soft X ray charge neutralization and ionizer neutralization. FIG. 6(a) shows performance characteristics of soft X ray charge neutralization, and FIG. 6(b) shows those of ionizer charge neutralization. As shown in FIG. 6(b), in the ionizer charge neutralization now widely used, high voltage is applied on an electrode unit 61, and ions 62 generated by high voltage are brought to necessary portion by airflow from a blower 63, and the electric charge is neutralized. In charge neutralization of a large size glass substrate 11 of 2 m in width, for instance, airflow moving at a speed of 20 m per second is needed to send ions from one end to the other for a distance of 2 m within about 0.1 second so that neutralization efficiency may not be decreased due to recombination of ions. Moreover, airflow speed must be maintained in a narrow gap, e.g. in a gap of 3 mm. Because airflow must be blown in, it is difficult to use the charge neutralizers 14 rradiating the ray from both sides of the glass substrate 11 placed on the stage 12 as in the case of the soft X ray charge neutralization as shown in FIG. 6(a).

According to the Patented Reference 1, which is a prior application by the present applicant, an earthed conductor is placed near and immediately under the glass substrate to be transported by a transport roller to increase static capacity (capacitance) between the earthed conductor and the glass substrate, and the charged electric potential of the glass substrate is decreased within a control value. Also, it is disclosed that charge neutralization is not performed at roller transport unit and charge neutralization of the glass substrate is performed by irradiating soft X ray from two charge neutralizers installed one on each side of the transport roller immediately before transporting it to accommodation stack in an accommodation chamber by the transport robot, i.e. when the glass substrate is lifted up from the transport roller by transport pin.

Also, according to the Patented Reference 2, soft X ray is irradiated toward the surrounding atmosphere of a charged object, and positive ions and negative ions are generated, and the charged electricity is neutralized.

Further, it is disclosed in the Patented Reference 3 that, in charge neutralization of the glass substrate with one side charged with electricity if soft X ray is irradiated from a side not electrically charged, the side not electrically charged is charged with opposite polarity. As a result, strong electric field is generated between front surface and rear surface of the glass substrate, thus leading to dielectric breakdown. To solve the problem, according to the Patented Reference 3, the soft X ray is irradiated only on the charged side, i.e. on the side where the glass substrate is in contact with supporting means, and electric charge is neutralized.

| [Patented Reference 1] | Japanese Patent Application 2005-35535 |
| [Patented Reference 2] | Japanese Patent Publication 2749202 |
| [Patented Reference 3] | JP-A-2004-299814 |

SUMMARY OF THE INVENTION

According to the invention described in the Patented Reference 1, when the glass substrate is lifted up from the table, soft X ray is irradiated into a gap between an earthed conductor and a glass substrate, and the glass substrate is neutralized. However, there is no concrete description as to how soft X ray is irradiated into the gap between the earthed conductor and the glass substrate. Also, when the glass substrate is lifted up too much, electrostatic capacity may be rapidly decreased and the charged electric potential may be increased, and this may cause troubles on the associated devices.

According to the invention described in the Patented Reference 3, soft X ray is irradiated after the glass substrate has been separated from its supporting means. Depending on the distance to separate the glass substrate from the supporting means, it may be possible to exceed the allowable in-plane potential difference or the allowable electric potential generated between the glass substrate and the earth. Also, there is no definite disclosure on concrete means to irradiate the soft X ray only on the electrically charged surface through the narrow gap when the separating distance is small.

In this respect, it is an object of the present invention to provide a charge neutralizer for neutralizing the glass substrate, by which it is possible to neutralize glass substrate by accurately irradiating a soft X ray into a narrow gap between the supporting means and the glass substrate immediately after the glass substrate is lifted up from the supporting means.

According to the present invention, optical axis of the soft X ray is accurately set into a gap between the glass substrate and the stage immediately after the glass substrate is lifted up from the table where the glass substrate is placed. For this purpose, adjusting means for adjusting mounting position of the soft X ray charge neutralizer and a soft X ray monitor for optical axis alignment are used. Also, under the condition not exceeding an allowable in-plane electric potential difference of the glass substrate or an allowable electric potential generated between the glass substrate and the earth in association with charge neutralizing conditions, the glass substrate is separated while the gap is widened, and it is advanced to the next process.

According to the present invention, it is possible to reliably neutralize by irradiating the soft X ray to the central portion of the transparent insulating substrate and to prevent electrostatic trouble, which may lead to the failure of the devices, under the condition that the charged electric potential does not exceed the allowable in-plane potential difference or the allowable electric potential value generated between the glass substrate and the earth immediately in the process that the glass substrate is lifting up from the table.

BRIEF DESCRIPTION OF THE DRAWINGS

FIG. 3 represents a drawing and a table to show the relation between in-plane potential difference and neutralization time;

BEST MODE FOR CARRYING OUT THE INVENTION

Figure 1:
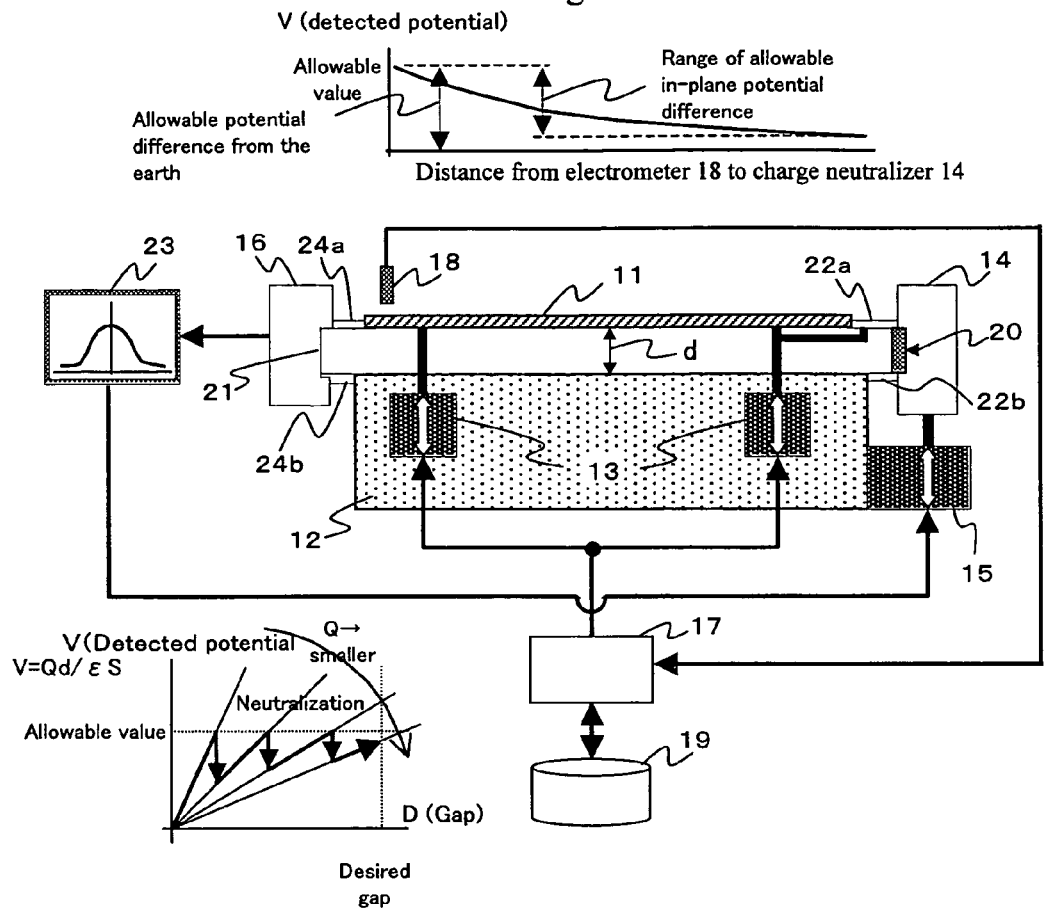
FIG. 1 represents diagrams and a drawing of a charge neutralizer for glass substrate according to the present invention.

Detailed description will be given below on an embodiment of the present invention referring to the drawings.

EXAMPLE 1

FIG. 1 represents diagrams and a drawing of a charge neutralizer for glass substrate according to the present invention. The charge neutralizer comprises a table 12 to place a glass substrate 11 on it, gap adjusting means 13 for separating the glass substrate 11 from the table 12 in order to send it to subsequent processes, a soft X ray charge neutralizer 14 for neutralizing rear side of the glass substrate 11 by, mounting position adjusting means 15 for aligning optical axis of the soft X ray charge neutralizer 14 to central position of a gap "d", a soft X ray optical axis monitor 16 provided with a detection sensor for adjusting the optical axis, a control unit 17 for controlling the gap adjusting means 13, an electrometer 18 for measuring charged electric potential of the glass substrate 11, and a database 19 for storing an in-plane potential difference value or an allowable potential value corresponding to a height to lift up the glass substrate 11 from the table 12.

In the soft X ray charge neutralizer 14 for ionizing as shown in FIG. 1, when the soft X ray can be introduced by aligning the optical axis even into a narrow gap, ionization occurs at a site where the soft X ray hits, and neutralizing action takes place. In this respect, the soft X ray from the soft X ray charge neutralizer 14 is introduced into a gap "d". Then, it is detected by the soft X ray optical axis monitor 16. The soft X ray charge neutralizer 14 is adjusted according to the detection output by the mounting position adjusting means 15, and optical axis is aligned.

However, ionization efficiency is attenuated in association with the distance. That is, as shown in upper portion of FIG. 1, when soft X ray is irradiated, neutralization efficiency differs between the front end and the furthest point (an end on the opposite side when the soft X ray is irradiated from one side; the central part of the glass substrate 11 when the soft X ray is irradiated from both sides) of the substrate 11 where the soft X ray charge neutralizer 14 is placed, and neutralization cannot be performed evenly. As a result, in-plane potential difference occurs. Also, at the furthest end, maximum potential is generated between the glass substrate and the earth. This in-plane potential difference or potential difference from the earth is one of the factors to cause troubles in product quality.

Here, description will be given on the in-plane potential difference referring to FIG. 3. FIG. 3 shows the relation between the elapsed time and the electric potential of the glass substrate to the earth, and the in-plane potential difference in case the lift-up of the glass substrate 11 from the table 12 being set to 10 cm when irradiation distance from the soft X ray charge neutralizer is 25 cm, 50 cm and 100 cm. The in-plane potential difference occurs depending on distance from the soft X ray charge neutralizer and time of irradiation. In this example, the in-plane potential difference is turned to zero after 0.5 second, while it reaches 2800 V when the time of 0.01 second has elapsed.

When the glass substrate is lifted up by 10 cm from the earth, a potential generated between the glass substrate and the earth of 3000 V at maximum occurs. Normally, the charged electric potential (3000 V) from the earth is greater than the in-plane potential difference (2800 V), and description will be given below by using charged electric potential from the earth.

First, a charged electric potential generated between the glass substrate and the earth allowable in terms of product quality is determined in advance. Next, on an area required of the glass substrate 11, the control unit measures the relation between the gap "d" and the charged electric potential when charge neutralization is not performed. The control unit also measures the relation between neutralization time and the charged electric potential when charge neutralization is performed. The measurement is performed by using the electrometer 18 and database is prepared and stored in the database 19.

Next, when the glass substrate is lifted up from the table, it is widened to a gap (distance) to be under the allowable value as shown in the diagram at left below of FIG. 1. When the allowable value is set to 100 V, it can be lifted up by 3 mm. The soft X ray is introduced into the gap thus prepared, and electric charge of the glass substrate is reduced. As a result, the generated charged electric potential is decreased.

Here, if it is supposed that the charged electric potential is Vo when the lift-up height is "do", the lift-up height "da" to suppress the potential difference to Va is given by: da=do×Va/Vo. Thus, if it is assumed that do=100 mm, Va=100 V, and Vo=3000 V, then da=100×100/3000≈3 (mm).

The value da=do×Va/Vo can be obtained as follows: If it is supposed that electrostatic capacity (capacitance) is Co when the electric charge on the glass substrate is Q and the lift-up height is do, the following relation exists: Q=Co×Vo. Because Co=∈S/do (where S is surface area of the glass substrate, and ∈ represents dielectric constant of the atmospheric air). Then, Q=∈S/do×Vo. When the lift-up height is da, the electric charge Q remains as it is unless it is neutralized. Thus, Q=∈S/da×Va. Therefore, when ∈S/da×Va=∈S/do×Vo, da=do×Va/Vo.

Further, the gap is widened within the range of the allowable value or lower, and soft X ray is irradiated and electric charge is reduced. This procedure is repeated. With the charged electric potential maintained at the allowable value or less, electric charge on the glass substrate is reduced by irradiating the soft X ray and the glass substrate is lifted up from the table to the desired gap. The glass substrate is picked up by a robot arm, and it is advanced to the next process.

The procedure to widen the gap between the glass substrate and the table (distance to be widened and lift-up speed) and optimal selection of neutralization time are performed according to the information from the database, and the substrate is lifted up to a gap as required within the shortest time not exceeding the allowable charged electric potential.

Figure 2:
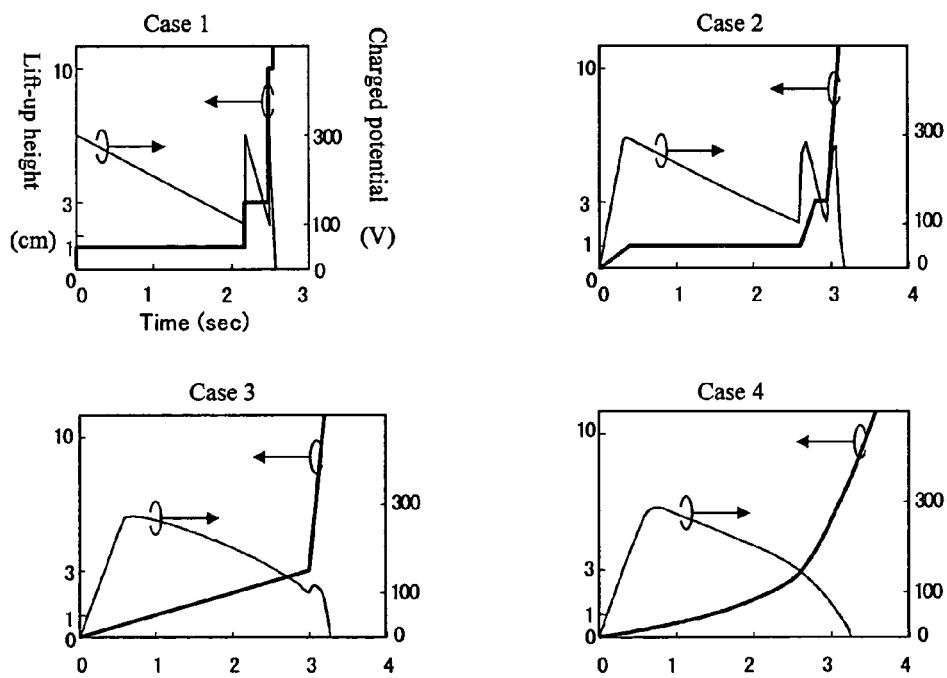
FIG. 2 represents diagrams to show the relation between lift-up height and neutralization time without exceeding an allowable charged electric potential.

FIG. 2 represents diagrams to show the relation between lift-up height and neutralization time not exceeding the allowable charged electric potential. Lift-up height is represented on the axis of ordinate on left side, and it is indicated by a leftward arrow on upper portion of the graph. The charged electric potential is represented on the axis of ordinate at right side and it is indicated by a rightward arrow on upper portion of the graph. Time is represented on the axis of abscissa.

FIG. 2 shows procedures to adjust the lift-up height to a value lower than the allowable charged electric potential and to neutralize it. In Cases 1 and 2, (1) it is lifted up within the allowable charged electric potential, and (2) neutralization is performed for a certain fixed period of time. The procedures of (1) and (2) are repeated. In Cases 3 and 4, neutralization is performed while the glass substrate is lifted up so that the allowable charged electric potential is not exceeded. Here, the allowable electric charge is set to 300 V.

EXAMPLE 2

As described above, it may be designed in such manner that the control unit 17 controls the gap adjusting means 13 according to the information from the database 19. In the present example, the gap "d" may be controlled by the gap adjusting means 13 by judging the neutralizing conditions as to whether the charged electric potential measured by the electrometer 18 is within the allowable value of the control unit 17 or not. In this case, it should be controlled in such manner that the electrometer 18 is installed at an end or at the center of the substrate where the charged electric potential is higher and that one of the potential values does not exceed the allowable value.

In the above, description has been given on the features of the present invention, while the soft X ray cannot be irradiated to the rear side of the glass substrate unless optical axis of the soft X ray irradiated from the charge neutralizer does not pass through the predetermined gap, and effective neutralization cannot be performed on the rear side. Also, the soft X ray irradiated from the charge neutralizer is invisible because the wavelength of soft X ray is not within visible light range, and it is not possible to visually adjust the optical axis.

In this respect, according to the present invention, rough alignment of optical axis can be achieved by measuring the optical axis of the soft X ray charge neutralizer 14 shown in FIG. 1, and a marking 20 is put near an exit window of the soft X ray charge neutralizer 14.

Figure 4A:
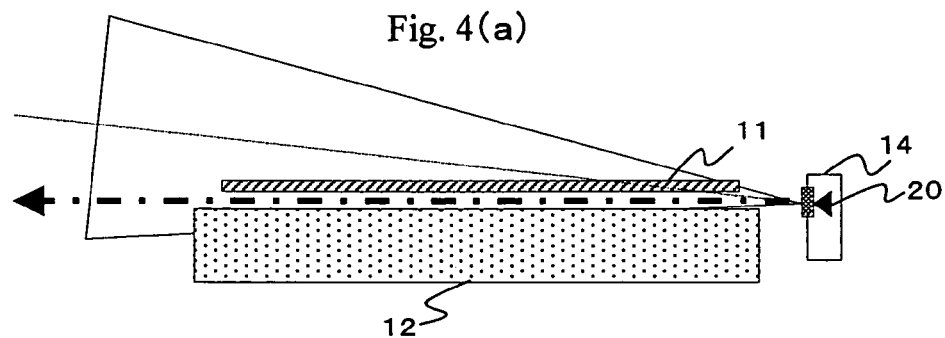
FIG. 4 represents drawings to show deviations of a soft X ray charge neutralizer.
Figure 4B:
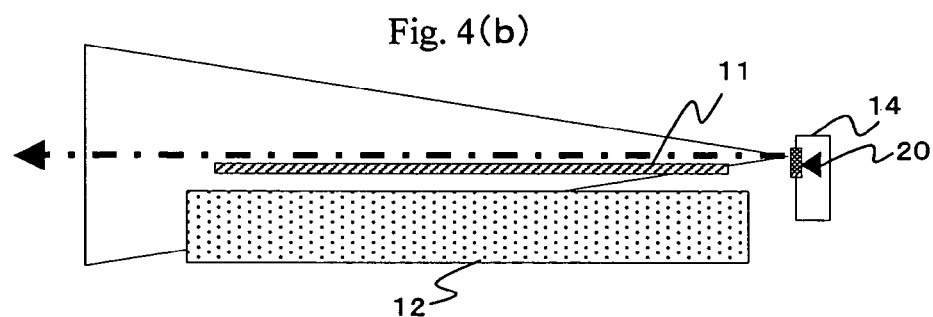
Figure 4C:
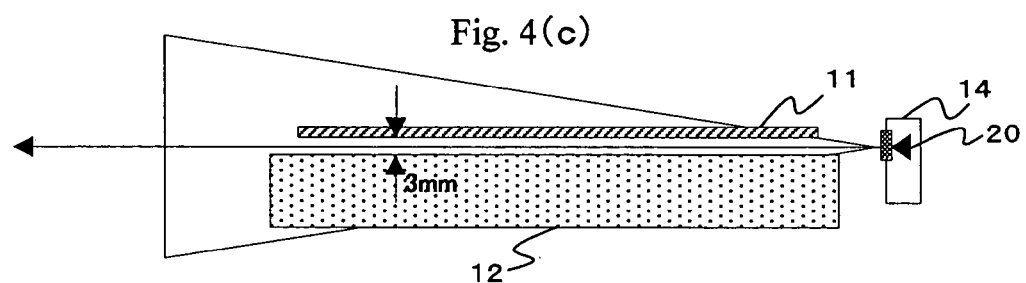
Figure 4D:
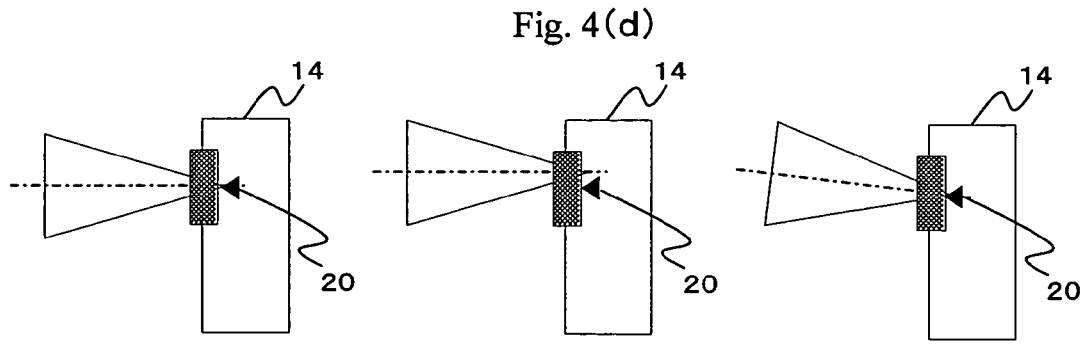

Now, description will be given on the marking referring to FIG. 4. FIG. 4 represents drawings to show deviations of the soft X ray charge neutralizer. FIG. 4(a) shows a case where irradiation angle deviates but there is few influence from the deviation. FIG. 4(b) shows a case where there is deviation in the irradiation position, and soft X ray is not irradiated on rear surface of the substrate depending on the deviation. FIG. 4(c) shows a suitable case. For example, the electric potential of the substrate to the earth becomes 3 kV when the substrate is lifted up by 10 cm. If this potential must be set to 100 V or lower, the soft X ray charge neutralizer should be installed so that an irradiation optical axis may become horizontal in the center of a gap 3 mm between the substrate 11 and the stage 12. FIG. 4(d) shows the example of the proper installation of a soft X ray charge neutralizer. The optical axis of a soft X ray charge neutralizer is deviated not only in up-down position (middle), but also in angle (right) from the most suitable position (left). As described above, there are deviations in irradiating direction of soft X ray in the soft X ray charge neutralizer on the installation to the actual device. Thus, it is necessary to measure the optical axis.

Also, in the charge neutralizer shown in FIG. 1, a slit 21 with an optimal width to detect the center of the gap is arranged on a detection sensor provided on the soft X ray optical axis monitor 16 to detect the intensity of the soft X ray. To prevent the intrusion of disturbance light into the slit, light guide plates 24a and 24b are provided above and under the slit 21 respectively.

Figure 5:
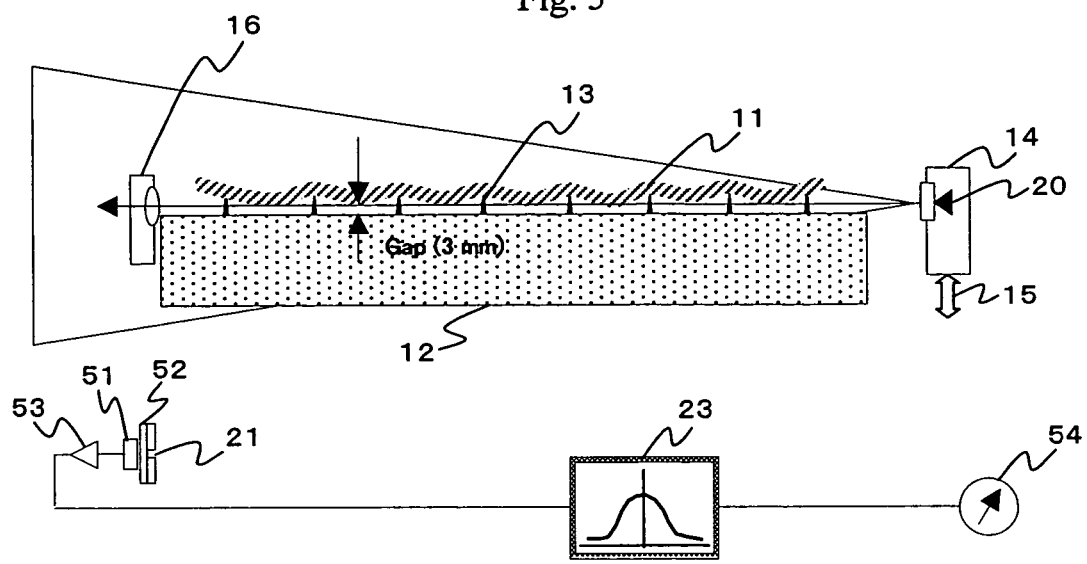
FIG. 5 is a schematical drawing to show adjusting of optical axis of soft X ray.
Figure 6:
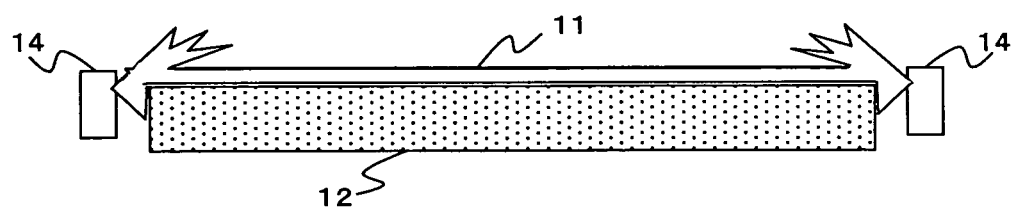
FIG. 6 represents drawings for comparing performance characteristics between the soft X ray charge neutralization and the ionizer neutralization.
Figure 6:
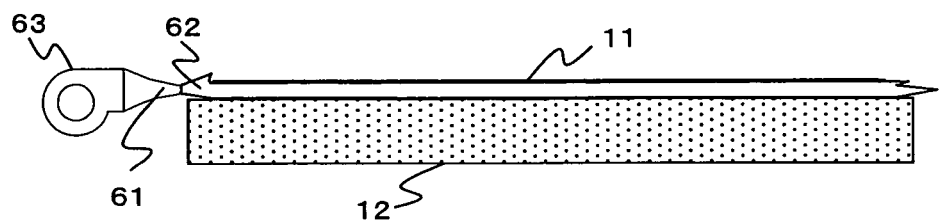

FIG. 5 shows a photo-sensor 51 used as the detection sensor. FIG. 5 is a schematical drawing to show adjusting of optical axis of the soft X ray. After passing through the slit 21 and a light-shielding aluminum foil 52, the soft X ray is detected by the photo-sensor 51 and is amplified by an amplifier 53, and position of the optical axis of the soft X ray charge neutralizer can be seen by a monitor 23. While observing the optical axis by this monitor and while watching output change of the sensor by a meter 54, mounting position of the soft X ray charge neutralizer is adjusted by the mounting position adjusting means 15.

Further, in the charge neutralizer shown in FIG. 1, shielding plates 22a and 22b are provided above and under the soft X ray charge neutralizer 14 to prevent the soft X ray from being irradiated to unnecessary area. Of these shielding plates, the upper shielding plate 22a is lifted up by the gap adjusting means 13 to the same horizontal level as the glass substrate 11. As a result, the soft X ray can be irradiated to the entire space extended by the lift-up without irradiating the soft X ray to the area which must not be irradiated such as upper surface of the glass substrate 11. A large amount of ions are generated, and the electric charge on the rear surface of the glass substrate can be neutralized with high efficiency.

What is claimed is:

1. A charge neutralizer, comprising a stage where a glass substrate is to be placed, gap adjusting means for lifting up the glass substrate from the stage, and a soft X ray charge neutralizer for irradiating a soft X ray into a gap between the glass substrate lifted up and the stage, wherein:

there are provided a soft X ray optical axis monitor for detecting said soft X ray, and mounting position adjusting means for adjusting mounting position of the soft X ray charge neutralizer based on a detection output from the soft X ray optical axis monitor.

2. A charge neutralizer according to claim 1, wherein rear surface of the glass substrate can be neutralized by irradiating said soft X ray.

3. A charge neutralizer according to claim 1, wherein said gap is not more than an allowable in-plane potential difference of the glass substrate.

4. A charge neutralizer according to claim 1, wherein said gap is not more than an allowable electric potential generated between the glass substrate and the earth.

5. A charge neutralizer according to claim 1, wherein neutralization is performed by widening said gap to a value within the allowable in-plane potential difference of the glass substrate and said gap is further widened within the allowable in-plane potential difference and neutralization is performed.

6. A charge neutralizer according to claim 1, wherein neutralization is performed by widening said gap within an allowable potential generated between the glass substrate and the earth, and said gap is further widened within the allowable potential and neutralization is performed.

7. A charge neutralizer according to claim 1, wherein neutralization is performed while widening said gap within an allowable potential difference of the glass substrate.

8. A charge neutralizer according to claim 1, wherein gap neutralization is performed while said gap is widened within an allowable potential generated between the glass substrate and the earth.

9. A charge neutralizer according to claim 1, wherein a marking is provided in advance at the position of the soft X ray irradiating position on said soft X ray charge neutralizer.

10. A charge neutralizer according to claim 1, wherein a slit for optical axis alignment is provided on a detection sensor of said soft X ray optical axis monitor.

11. A charge neutralizer according to claim 1, wherein a shielding plate for preventing irradiation of soft X ray to unnecessary area is provided on said soft X ray charge neutralizer.

12. A charge neutralizer according to claim 11, wherein, among said shielding plate, an upper shielding plate is lifted up to the same horizontal position as said glass substrate.

13. A charge neutralizer according to claim 1, wherein a light guide plate for preventing intrusion of scattered X ray is provided on said soft X ray optical monitor.

14. A charge neutralizer, comprising a stage where a glass substrate is to be placed, gap adjusting means for lifting up the glass substrate from the stage, a soft X ray charge neutralizer for irradiating a soft X ray into a gap between the glass substrate lifted up and the stage, a soft X ray optical axis monitor for detecting the soft X ray, and mounting position adjusting means for adjusting mounting position of the soft X ray charge neutralizer based on a detection output from the soft X ray optical axis monitor, wherein:

a control unit is provided to control said gap adjusting means based on information from a database.

15. A charge neutralizer, comprising a stage where a glass substrate is to be placed, gap adjusting means for lifting up the glass substrate from the stage, a soft X ray charge neutralizer for irradiating a soft X ray into a gap between the glass substrate lifted up and the stage, a soft X ray optical axis monitor for detecting the soft X ray, and mounting position adjusting means for adjusting mounting position of the soft X ray charge neutralizer based on a detection output from the soft X ray optical axis monitor, wherein:

there is provided a control unit for controlling said gap adjusting means based on a detection output from an electrometer.

16. A charge neutralizer according to claim 14, wherein the database stores information of at least one of an in-plane potential difference value and an allowable potential value corresponding to a height to lift up the glass substrate from the stage.

* * * * *